United States Patent
Ohashi

(10) Patent No.: US 10,326,066 B2
(45) Date of Patent: Jun. 18, 2019

(54) LIGHT EMITTING ELEMENT-MOUNTING SUBSTRATE AND LIGHT EMITTING APPARATUS

(71) Applicant: KYOCERA CORPORATION, Kyoto-shi, Kyoto (JP)

(72) Inventor: Yoshio Ohashi, Satsumasendai (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 15/771,133

(22) PCT Filed: Oct. 27, 2016

(86) PCT No.: PCT/JP2016/081908
§ 371 (c)(1),
(2) Date: Apr. 26, 2018

(87) PCT Pub. No.: WO2017/073680
PCT Pub. Date: May 4, 2017

(65) Prior Publication Data
US 2018/0331264 A1 Nov. 15, 2018

(30) Foreign Application Priority Data
Oct. 29, 2015 (JP) ................ 2015-213067

(51) Int. Cl.
*H01L 33/56* (2010.01)
*H01L 33/62* (2010.01)
(Continued)

(52) U.S. Cl.
CPC .............. *H01L 33/62* (2013.01); *C03C 8/02* (2013.01); *C03C 8/04* (2013.01); *C03C 8/18* (2013.01); *C03C 8/20* (2013.01); *C03C 14/004* (2013.01); *C04B 35/10* (2013.01); *H01L 33/60* (2013.01); *H01L 2224/48091* (2013.01); *H01L 2924/181* (2013.01)

(58) Field of Classification Search
CPC .......... H01L 33/60; H01L 33/62; C03C 8/04; C03C 8/20; C03B 35/10
See application file for complete search history.

(56) References Cited

U.S. PATENT DOCUMENTS

| | | | | |
|---|---|---|---|---|
| 6,039,622 A * | 3/2000 | Kosaka | ...................... | H01J 9/20 445/24 |
| 6,413,619 B1 * | 7/2002 | Hamada | ................... | C03C 4/02 106/31.05 |

(Continued)

FOREIGN PATENT DOCUMENTS

| | | | | |
|---|---|---|---|---|
| EP | 3355369 A1 * | 8/2018 | ............. | H01L 33/60 |
| EP | 3355369 A4 * | 8/2018 | ............. | H01L 33/60 |

(Continued)

*Primary Examiner* — Earl N Taylor
(74) *Attorney, Agent, or Firm* — Viering, Jentschura & Partner MBB

(57) ABSTRACT

A light emitting element-mounting substrate of the present disclosure includes a base body, a metal layer and a glass layer. The base body is formed of ceramics. The metal layer is disposed on the base body, and contains copper as a main component. The glass layer is disposed on the metal layer, has a white color tone and contains a compound including titanium and oxygen.

6 Claims, 1 Drawing Sheet

(51) Int. Cl.
  *H01L 33/60* (2010.01)
  *C03C 8/02* (2006.01)
  *C03C 8/18* (2006.01)
  *C03C 8/20* (2006.01)
  *C03C 14/00* (2006.01)
  *C03C 8/04* (2006.01)
  *C04B 35/10* (2006.01)

(56) References Cited

U.S. PATENT DOCUMENTS

| | | | | |
|---|---|---|---|---|
| 6,525,468 | B1* | 2/2003 | Wada | H01B 1/16 |
| | | | | 252/502 |
| 7,456,500 | B2* | 11/2008 | Kromotis | H01L 25/0753 |
| | | | | 257/676 |
| 9,159,892 | B2* | 10/2015 | Fukushima | H01L 33/62 |
| 9,484,504 | B2* | 11/2016 | Bibl | H01L 33/504 |
| 9,708,492 | B2* | 7/2017 | Kojima | C08K 3/22 |
| 9,865,837 | B2* | 1/2018 | Yamazaki | H01L 51/5253 |
| 2004/0246204 | A1* | 12/2004 | Aoki | C03C 4/16 |
| | | | | 345/60 |
| 2005/0093146 | A1* | 5/2005 | Sakano | H01L 33/62 |
| | | | | 257/730 |
| 2005/0133808 | A1* | 6/2005 | Uraya | H01L 33/486 |
| | | | | 257/99 |
| 2005/0236628 | A1* | 10/2005 | Matsuura | H01L 33/60 |
| | | | | 257/79 |
| 2008/0185962 | A1* | 8/2008 | Kato | C03C 3/066 |
| | | | | 313/586 |
| 2008/0217648 | A1* | 9/2008 | Ohara | C09K 11/08 |
| | | | | 257/103 |
| 2010/0086771 | A1* | 4/2010 | Nageno | C03C 3/089 |
| | | | | 428/332 |
| 2011/0006316 | A1* | 1/2011 | Ing | G02F 1/133611 |
| | | | | 257/89 |
| 2011/0064958 | A1* | 3/2011 | Hirose | C23C 14/10 |
| | | | | 428/446 |
| 2011/0309404 | A1* | 12/2011 | Lee | H01L 33/486 |
| | | | | 257/99 |
| 2011/0309405 | A1* | 12/2011 | Lee | H01L 33/486 |
| | | | | 257/99 |
| 2012/0061709 | A1* | 3/2012 | Pachler | H01L 33/60 |
| | | | | 257/98 |
| 2012/0091489 | A1* | 4/2012 | Aoki | F21K 9/00 |
| | | | | 257/98 |
| 2012/0113650 | A1* | 5/2012 | Inoue | C04B 41/5022 |
| | | | | 362/296.02 |
| 2012/0181560 | A1* | 7/2012 | Hiramatsu | H01L 33/60 |
| | | | | 257/98 |
| 2013/0004779 | A1* | 1/2013 | Ogata | H01L 33/60 |
| | | | | 428/434 |
| 2013/0020590 | A1* | 1/2013 | Lin | H01L 33/60 |
| | | | | 257/88 |
| 2013/0037842 | A1* | 2/2013 | Yamada | H01L 33/60 |
| | | | | 257/98 |
| 2013/0099276 | A1* | 4/2013 | Fukushima | H01L 33/46 |
| | | | | 257/99 |
| 2013/0328091 | A1* | 12/2013 | Fuke | H01L 33/60 |
| | | | | 257/98 |
| 2014/0327024 | A1* | 11/2014 | Ishihara | H01L 24/97 |
| | | | | 257/98 |
| 2015/0171281 | A1* | 6/2015 | Nakabayashi | H01L 33/486 |
| | | | | 257/98 |
| 2015/0252964 | A1* | 9/2015 | Takahashi | F21K 9/60 |
| | | | | 362/84 |
| 2015/0340569 | A1* | 11/2015 | Tamaki | H01L 33/56 |
| | | | | 257/98 |
| 2015/0340578 | A1* | 11/2015 | Tamaki | H01L 33/62 |
| | | | | 257/99 |
| 2015/0353740 | A1* | 12/2015 | Kojima | F21V 19/001 |
| | | | | 362/296.04 |
| 2016/0225944 | A1* | 8/2016 | Nishimura | H01L 33/0095 |
| 2017/0092816 | A1* | 3/2017 | Ikeda | H01L 33/465 |
| 2017/0328545 | A1* | 11/2017 | Konishi | H01L 23/36 |
| 2018/0258289 | A1* | 9/2018 | Kniess | C09C 3/063 |

FOREIGN PATENT DOCUMENTS

| | | | | |
|---|---|---|---|---|
| JP | 2002033517 | A | | 1/2002 |
| JP | 2009129801 | A | | 6/2009 |
| JP | 2011129646 | A | * | 6/2011 |
| JP | 2011129646 | A | | 6/2011 |
| JP | 2012124358 | A | | 6/2012 |
| JP | 2012140479 | A | | 7/2012 |
| WO | 2011118639 | A1 | | 9/2011 |
| WO | WO-2012002580 | A1 | * | 1/2012 ............ H01L 33/46 |
| WO | 2015009377 | A1 | | 1/2015 |
| WO | WO-2017073680 | A1 | * | 5/2017 ............ H01L 33/60 |

* cited by examiner

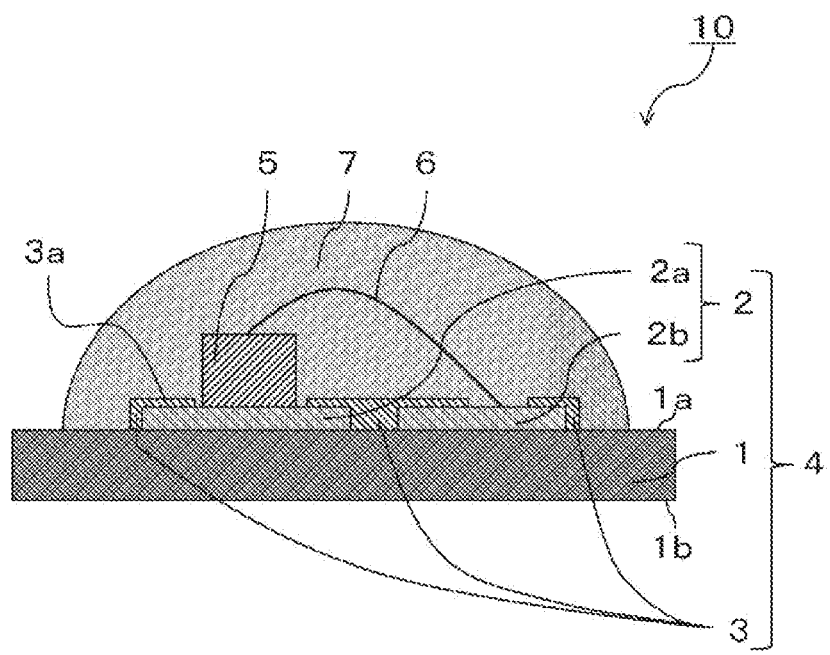

LIGHT EMITTING ELEMENT-MOUNTING SUBSTRATE AND LIGHT EMITTING APPARATUS

CROSS-REFERENCE TO RELATED APPLICATIONS

This application is a national stage entry according to 35 U.S.C. 371 of PCT Application No. PCT/JP2016/081908 filed on Oct. 27, 2016, which claims priority to Japanese Application No. 2015-213067 filed on Oct. 29, 2015, which are entirely incorporated herein by reference.

TECHNICAL FIELD

The present disclosure relates to a light emitting element-mounting substrate and a light emitting apparatus.

BACKGROUND ART

As a light emitting element with low electric power consumption, light emitting diodes (LED) are attracting attention. For mounting such LED, an insulating substrate is used and a metal layer acting as a circuit (wiring) is provided on this substrate.

Under such a constitution, the heat at the output of LED exerts an influence on performance and reliability of LED, thus, a resin is used as the substrate material for low output LED and ceramics is used as the substrate material for medium or above output LED.

In a light emitting apparatus having a light emitting element on a metal layer of a substrate having the above-described constitution, the substrate and the metal layer disposed on the substrate are covered with a white color tone resin (hereinafter, described as white resin) for the purpose of improvement of light emission efficiency, protection of the metal layer and the like (see, Patent Literature 1)

CITATION LIST

Patent Literature

Patent Literature 1: Japanese Unexamined Patent Publication JP-A 2009-129801

SUMMARY OF INVENTION

A light emitting element-mounting substrate of the present disclosure comprises a base body formed of ceramics; a metal layer disposed on the base body, and containing copper as a main component; and a glass layer disposed on the metal layer, having a white color tone, and containing a compound comprising titanium and oxygen.

The FIGURE is a cross-sectional view showing one example of a light emitting apparatus having the light emitting element-mounting substrate of the present disclosure.

DESCRIPTION OF EMBODIMENTS

With recent increase in luminance, a lot of heat is transferred to a metal layer. Since the metal layer has high thermal conductivity, a large amount of heat is transferred also to a white resin. When a lot of heat is transferred to the white resin as described above, close adhesion between the metal layer and the white resin tends to lower. If the white resin is peeled off from the metal layer, light emission efficiency lowers and the metal layer cannot be protected, thus, high light emission efficiency of LED cannot be brought out for a long period of time.

The light emitting element-mounting substrate of the present disclosure can bring out high luminance and high light emission efficiency for a long period of time. The light emitting element-mounting substrate of the present disclosure will be described in detail referring to a drawing below.

The FIGURE is a cross-sectional view showing one example of the light emitting apparatus having the light emitting element-mounting substrate of the present disclosure.

As shown in the FIGURE, the light emitting element-mounting substrate 4 of the present disclosure has a base body 1 formed of ceramics, a metal layer 2 disposed on the base body 1, containing copper as a main component, and a glass layer 3 disposed on the base body 1 and the metal layer 2.

Here, the main component in the metal layer 2 refers to a component which accounts for 50% by mass or more of 100% by mass of the total of all components constituting the metal layer 2. The metal layer 2 has low electrical resistivity and high heat dissipation since a main component thereof is copper as described above. The metal layer 2 may also contain zirconium, titanium, molybdenum, tin and the like in addition to copper.

The light emitting apparatus 10 of the present disclosure has a light emitting element 5 mounted on a metal layer 2a of the light emitting element-mounting substrate 4 having the above-described constitution. The FIGURE shows an example in which the light emitting element 5 is electrically connected via a bonding wire 6 to a metal layer 2b juxtaposed to the metal layer 2a. Further, the FIGURE shows an example in which a surface of the light emitting element-mounting substrate 4 on the side where the light emitting element 5 is mounted is covered together with the light emitting element 5 with a sealing material 7. This sealing material 7 may contain a fluorescent material and the like for wavelength conversion.

The glass layer 3 of the light emitting element-mounting substrate 4 of the present disclosure exists on at least a part of the base body 1 and the metal layer 2 and has a white color tone. The glass layer 3 contains a compound comprising titanium and oxygen. The glass layer 3 of the light emitting-mounting element substrate 4 of the present disclosure has high reflection rate in the visible light range since the glass layer 3 contains a compound comprising titanium and oxygen as described above.

The reason why high reflection rate can be provided in the visible light range is that visible light can be reflected efficiently because of high refractive index of the compound (for example, $TiO_2$) composed of titanium and oxygen. The compound comprising titanium and oxygen may have a form in which a compound composed of titanium and oxygen is present as a nucleus and the other compound is formed so as to cover the nucleus. Regarding the size of such a compound, its diameter may be not less than 0.2 μm and not more than 2.0 μm.

Since the glass layer 3 contains a compound comprising titanium and oxygen, a difference in thermal expansion coefficient between the glass layer 3 and the metal layer 2 containing copper as a main component is smaller, and thus, peeling when heat generated at the time of output of the light emitting element 5 is transmitted is suppressed. Hence, the light emitting element-mounting substrate 4 of the present disclosure can bring out high luminance and high light emission efficiency over a long period of time owing to excellent reflection rate and suppression of peeling of the glass layer 3.

The compound contained in the glass layer 3 may be confirmed by measuring the glass layer 3 using an X-ray diffractometer (XRD) and checking the obtained result with the JCPDS card.

Alternatively, the compound contained in the glass layer 3 can also be confirmed by using an energy dispersive X-ray spectrometer (EDS) attached to a scanning electron microm-eter (SEM). First, the light emitting element-mounting substrate 4 is cut, and polished by a cross-section polisher (CP). Next, the polished cross-section is adopted as an observation surface and observed using the SEM at not less than 1000 and not more than 10000-fold magnification. Next, a position visually-recognized as particle is irradiated with X-ray by the EDS attached to the SEM. If the presence of Ti and O is recognized at this position, it can be considered that a compound comprising titanium and oxygen exists.

Alternatively, if a region where Ti exists and a region where O exists overlap in element mapping at a position visually recognized as particle using an electron probe microanalyzer (EPMA), it can be considered that a compound comprising titanium and oxygen exists.

In the light emitting element-mounting substrate 4 of the present disclosure, an area occupying ratio of the compound in the glass layer 3 may be not less than 24 area % and not more than 60 area %. When such a constitution is satisfied, the glass layer 3 becomes more white and the reflection rate in the visible light range can be further improved. Further, when heat generated at the time of output of the light emitting element 5 is transmitted, peeling of the glass layer 3 can be further suppressed.

The area occupying ratio of the compound in the glass layer 3 may be calculated, for example, by the following method. First, an observation surface described above is observed using the SEM at 3000-fold magnification, and photographed. Next, on the photograph taken, a measurement area in the glass layer 3 is adjusted to 220 µm², and then, binarization is conducted by coloring a position of the compound comprising titanium and oxygen, using image analysis software. Next, the area occupying ratio of the compound is determined by calculating the ratio of the colored position in the measurement area. This operation is carried out at any five positions and the average of the obtained measurement values is the area occupying ratio of the compound in the glass layer 3.

In the light emitting element-mounting substrate 4 of the present disclosure, the arithmetic mean roughness Ra on the surface 3a of the glass layer 3 may be not less than 0.18 µm and not more than 0.3 µm. When such a constitution is satisfied, since the reflection rate of visible light on the surface 3a of the glass layer 3 is enhanced, the reflection rate in the visible light range is further improved.

The arithmetic mean roughness Ra on the surface 3a of the glass layer 3 may be calculated from the results of measurement of the surface 3a of the glass layer 3 according to JIS B 0601-2001 using a contact or non-contact roughness measuring instrument. Measurement of the surface 3a of the glass layer 3 is carried out at any five positions, and the average of the obtained measurement values is the arithmetic mean roughness Ra on the surface 3a of the glass layer 3.

The glass layer 3 of the light emitting element-mounting substrate 4 of the present disclosure contains copper or zinc, and the total content of copper and zinc in the glass layer 3 may be larger in the metal layer side region than in the surface side region. Under such a constitution, the close adhesion strength between the metal layer 2 and the glass layer 3 is improved while maintaining the reflection efficiency of visible light on the surface 3a of the glass layer 3 high, and thus, peeling of the glass layer 3 can be further suppressed.

For the glass layer 3 appearing in the cross-section obtained by cutting the light emitting element-mounting substrate 4 in the thickness direction, the thickness of the glass layer 3 which is the distance from the metal layer 2 to the surface 3a is divided into three equal parts, and the region of ⅓ of the thickness of the glass layer 3 including the surface 3a is the surface side region of the glass layer 3. The metal layer side region of the glass layer 3 is the region of ⅓ of the thickness of the glass layer 3 including the interface between the metal layer 2 and the glass layer. In the glass layer 3, the region sandwiched by the surface side region and the metal layer side region is referred to as the intermediate region.

In the glass layer 3 of the light emitting element-mounting substrate 4 of the present disclosure, the total content of copper and zinc may gradually increase from the surface side region to the metal layer side region. Under such a constitution, the close adhesion strength between the metal layer 2 and the glass layer 3 is improved more, thus, peeling of the glass layer 3 can be further suppressed. The gradual increase means that the total content of copper and zinc satisfies the following relation: metal layer side region> intermediate region> surface side region.

When the total content of copper and zinc in the metal layer side region of the glass layer 3 is 3% by mass or more, the close adhesion strength between the metal layer 2 and the glass layer 3 is further improved.

The total content of copper and zinc in the glass layer 3 may be calculated by the following method. Further, the light emitting element-mounting substrate 4 is cut in the thickness direction and polished by the CP. Next, the polished cross-section is adopted as an observation surface and observed using the SEM at not less than 1000 and not more than 10000-fold magnification. Then, the surface side region, the intermediate region and the metal layer side region of the glass layer 3 are irradiated with X-ray and the content of copper and zinc is measured by the EDS attached to the SEM. Whether the total content of copper and zinc is larger in the metal layer side region than in the surface side region or whether the total content thereof increases gradually may be decided by confirming the total content of copper and zinc in the surface side region, the intermediate region and the metal layer side region.

In the light emitting element-mounting substrate 4 of the present disclosure, the glass layer 3 may contain zirconia. Under such a constitution, the reflection rate is further improved since the refractive index of zirconia is high and the refractive index of the compound comprising titanium and oxygen is difference from the refractive index of zirconia.

The base body 1 constituting the light emitting element-mounting substrate 4 of the present disclosure is composed of ceramics, and aluminum oxide-based ceramics, zirconium oxide-based ceramics, composite ceramics composed of aluminum oxide and zirconium oxide, silicon nitride-based ceramics, aluminum nitride-based ceramics, silicon carbide-based ceramics, mullite-based ceramics and the like can be used as the ceramics. If the base body 1 is formed of an aluminum oxide-based ceramics, the base body 1 gets excellent mechanical strength in addition to relatively easy processability. If the base body 1 is formed of an aluminum nitride-based ceramics, the base body 1 gets more excellent heat dissipation.

For example, the aluminum oxide-based ceramics is ceramics containing aluminum oxide as the main component, and contains aluminum oxide in a proportion of 70% by mass or more with respect to 100% by mass of all components constituting the ceramics. The material of the base body 1 constituting the light emitting element-mounting substrate 4 of the present disclosure can be confirmed by the following method. First, the presence of aluminum oxide is confirmed by measuring the base body using an XRD and checking the obtained result with the JCPDS card. Next, quantitative analysis of aluminum (Al) is performed using an ICP (Inductively Coupled Plasma) emission spectrophotometer (ICP) or an X-ray fluorescence spectrometer (XRF). The content of Al measured by an ICP or XRF is converted to the content of aluminum oxide ($Al_2O_3$) and when the converted content is 70% by mass or more, it is an aluminum oxide-based ceramics. The same applies to other ceramics.

A through hole may be formed in the base body 1. When the through hole is formed in the base body 1 and a through electrode composed of an electrically conductive substance is formed in the through hole, connection to an external electrode can be attained. When a thermal via composed of a highly thermally conductive substance is formed in the through hole, the heat dissipation of the base body 1 can be improved.

Next, those containing any of an $R_2O$—$B_2O_3$—$SiO_2$-based material (R: alkali metal element), an $SiO_2$—$Bi_2O_3$—$B_2O_3$-based material and an $R_2O$—$SiO_2$—$B_2O_3$—$Bi_2O_3$-based material as the main component are advantageous as the glass layer 3. The softening points of these compounds are not lower than 700° C. and not higher than 780° C.

One example of the production method of the light emitting element-mounting substrate 4 of the present disclosure will be illustrated below. First, for example, aluminum nitride-based ceramics and aluminum oxide-based ceramics are prepared, as the base body 1, by known molding methods and firing methods. In fabrication of the aluminum oxide-based ceramics, barium oxide (BaO) and zirconium oxide ($ZrO_2$) may be contained for improving the reflection rate of the base body 1.

When the through hole is formed in the base body 1, the through hole may be formed together with formation of the external form in molding. Alternatively, a hole may be formed by punching, blast or laser for a molded body having undergone processing of only the external form. Alternatively, a hole may be formed by blast or laser on a sintered body. The thickness of the base body 1 is, for example, not less than 0.15 mm and not more than 1.5 mm.

Next, the metal layer 2 can be formed by screen-printing a pattern of wiring and electrodes on the base body 1 using a known metal paste containing copper as the main component, and then, firing it under a nitrogen atmosphere. The thickness of the metal layer 2 is, for example, not less than 10 μm and not more than 18 μm. For controlling the thickness of the metal layer 2 at desirable level, printing, drying and thermal treatment may be repeated, or steps until printing and drying may be conducted several times before collective thermal treatment.

Next, a glass paste is prepared for forming the glass layer 3. First, glass powder containing any of an $R_2O$—$B_2O_3$—$SiO_2$-based material (R: alkali metal element), an $SiO_2$—$Bi_2O_3$—$B_2O_3$-based material and an $R_2O$—$SiO_2$—$B_2O_3$—$Bi_2O_3$-based material as the main component is prepared. The average particle size of the glass powder is, for example, not less than 2 μm and not more than 4 μm.

Further, titanium oxide powder having an average particle size of not less than 0.1 μm and not more than 2.0 μm is prepared. The titanium oxide powder is weighed so that the amount thereof is not less than 15 parts by mass and not more than 25 parts by mass with respect to 100 parts by mass of the glass powder.

Next, an organic vehicle is prepared. The organic vehicle is obtained by dissolving an organic binder in an organic solvent, and for example, the mass ratio of the organic binder to the organic solvent is 1:2 to 6. One or more substances selected from, for example, acryls such as polybutyl methacrylate and polymethyl methacrylate, celluloses such as nitro cellulose, ethyl cellulose, cellulose acetate and butyl cellulose, polyethers such as polyoxymethylene, and polyvinyls such as polybutadiene and polyisoprene can be mixed and used as the organic binder.

One or more substances selected from, for example, carbitol, carbitol acetate, terpineol, meta-cresol, dimethylimidazole, dimethylimidazolidinone, dimethyl formamide, diacetone alcohol, triethylene glycol, p-xylene, ethyl lactate and isophorone can be mixed and used as the organic solvent.

The glass powder, the titanium oxide powder and the organic vehicle are weighed in desired amounts and mixed, to prepare a glass paste. Regarding the blending amounts, it may be recommendable that the amount of mixed powder of the glass powder and the titanium oxide powder is not less than 60 parts by mass and not more than 80 parts by mass with respect to 100 parts by mass of the glass paste and the rest is the organic vehicle, for example.

When the glass layer 3 contains zirconia, it may be recommendable that zirconia powder having an average particle size of not less than 0.1 μm and not more than 2 μm is prepared and weighed so that its amount is not less than 0.1 part by mass and not more than 5 parts by mass with respect to 100 parts by mass of the glass powder, and added to the above-described glass paste.

The obtained glass paste is printed so as to cover desired regions on the base body 1 and the metal layer 2, and dried and defatted at temperatures of not lower than 80° C. and not higher than 140° C.

In the case wherein the glass layer 3 contains copper or zinc and the total content of copper and zinc in the glass layer 3 is larger in the metal layer side region than in the surface side region, it may be recommendable that a glass paste is prepared as described below and printed so as to cover desired regions. First, in preparation of the above-described glass paste, copper powder and zinc powder are added, and 3 kinds of glass pastes having different total contents of copper and zinc are prepared. Specifically, a first glass paste forming the metal layer side region, a second glass paste forming the intermediate region and a third glass paste forming the surface side region, in the glass layer 3, are prepared. The first glass paste is prepared so that the total content of copper and zinc is larger than in the third glass paste. It may be recommendable that the first glass paste is printed so as to cover desired regions on the base body 1 and the metal layer 2, the second glass paste is printed on the first glass paste, and the third glass paste is printed on the second glass paste.

If each glass paste is prepared so that the total content of copper and zinc satisfies the following relation: first glass paste > second glass paste > third glass paste, the total content of copper and zinc gradually increases from the surface side region to the metal layer side region in the glass layer 3.

Next, the printed glass paste is thermally treated by keeping it under a nitrogen atmosphere at a maximum temperature of not lower than 800° C. and not higher than 950° C. for not shorter than 2 minutes and not longer than 15 minutes. When the maximum temperature in the thermal treatment is higher or when the time of the thermal treatment is longer, a larger amount of the compound comprising titanium and oxygen can be deposited, however, when the maximum temperature is higher than 950° C. or when the keeping time of the maximum temperature is 15 minutes or longer, carbon that could not be removed during degreasing bursts, to form pin holes inside the glass layer 3, thereby hindering whitening.

The thickness of the glass layer 3 is, for example, not less than 10 µm and not more than 20 µm. Through the above-described process, the light emitting element-mounting substrate 4 of the present disclosure can be obtained.

For obtaining the arithmetic mean roughness Ra on the surface of the glass layer 3, the surface of the glass layer 3 may be ground using a surface grinding machine.

Further, the surface of the metal layer 2 not covered with the glass layer 3 may be partially plated. By conducting a plating treatment as described above, it becomes easy to perform a close adhesion treatment of the light emitting element 5 and the bonding wire 6, and corrosion of the metal layer 2 due to oxidation can be suppressed. The plating may be publicly known plating and examples thereof include gold plating, silver plating, nickel-gold plating and nickel-palladium-gold plating.

In fabrication of the light emitting element-mounting substrate 4 of the present disclosure, if the base body 1 having split grooves formed thereon is used and the metal layer 2 and the glass layer 3 are formed by the above-described method, and then, the base body 1 is split, it is possible to efficiently fabricate a lot of light emitting element-mounting substrates 4. The production method of the light emitting element-mounting substrate 4 of the present disclosure is not limited to the above-described production method.

Next, the light emitting apparatus 10 of the present disclosure can be obtained, for example, by mounting the light emitting element 5 on the metal layer 2a of the light emitting element-mounting substrate 4 of the present disclosure. The light emitting apparatus 10 of the present disclosure fabricated as described above can bring out high luminance and high light emission efficiency over a long period of time.

Examples of the present disclosure will be illustrated specifically below, but the present disclosure is not limited to the following examples.

Example 1

Samples of different constitutions were fabricated and subjected to tests of reflection rate and heat cycle. First, aluminum oxide-based ceramics having a thickness of 1.0 mm was prepared as a base body. Next, a metal paste containing copper as the main component was screen-printed on the base body, and then fired under a nitrogen atmosphere, to form a metal layer having a thickness of 14 µm.

Next, $R_2O$—$B_2O_3$—$SiO_2$-based glass powder (R: alkali metal element) having an average particle size of 3 µm was prepared. Further, titanium oxide powder having an average particle size of 1 µm was prepared. The titanium oxide powder was weighed so as to give amounts shown in Table 1 with respect to 100 parts by mass of the glass powder.

Next, an organic vehicle was prepared, and desired amounts of the glass powder, the titanium oxide powder and the organic vehicle were weighed and mixed, to prepare a glass paste. Regarding the blending amount, the total of the glass powder and the titanium oxide powder was 70 parts by mass and the rest was the organic vehicle.

The obtained glass paste was printed so as to cover desired regions on the base body and the metal layer, and dried and degreased at a temperature of 120° C.

Next, the printed glass paste was thermally treated by keeping under a nitrogen atmosphere at the maximum temperature shown in Table 1 for 5 minutes, to obtain sample Nos. 1 to 11 in which the thickness of the glass layer was 16 µm and the longitudinal size×the lateral size were 17 mm×17 mm. For each sample, multiple copies were fabricated for conducting the heat cycle test.

Each sample was observed at 3000-fold magnification using the SEM and photographed and the measurement area in the glass layer was adjusted to 220 µm$^2$, then, binarization was conducted by coloring a position of the compound comprising titanium and oxygen, using image analysis software. Next, the area occupying ratio of the compound was determined by calculating the ratio of the colored position in the measurement area. This operation was carried out at any five positions, and the average of the obtained measurement values was the area occupying ratio of the compound.

The glass layer of each sample was measured using a spectrophotometer (CM-3700A manufactured by Minolta) under conditions of a reference light source of D65, a wavelength range of 360 to 740 nm, a field of view of 10° and an illumination size of 3×5 mm, and reflection rate at 500 nm was measured from the measurement results.

The heat cycle test was conducted by the following method. First, 16 copies of each sample were prepared, and a cycle in which the environmental temperature of each sample was lowered from room temperature (25° C.) to −40° C. and kept for 30 minutes and raised to 125° C. and kept for 30 minutes, and then lowered to room temperature, was regarded as one cycle and repeated, using a cold and heat impact test element. During 2500 cycles to 4500 cycles, each one of the each sample was taken out every 100 cycles, and a polyester film was pasted onto the surface of the glass layer and a peel test was conducted by pulling the film upward. The number of cycles when peeling of the glass layer from the metal layer was confirmed was examined by this peel test. The results are shown in Table 1.

TABLE 1

| Sample No. | Titanium oxide (Part by mass) | Thermal treatment temperature (° C.) | Area occupying ratio of compound (Area %) | Reflection rate at 500 nm (%) | Number of cycles (Number) |
| --- | --- | --- | --- | --- | --- |
| 1 | 15 | 750 | 0 | 39.8 | 2800 |
| 2 | 15 | 775 | 8 | 43.1 | 3500 |
| 3 | 15 | 800 | 15 | 45.6 | 3600 |
| 4 | 15 | 850 | 24 | 48.8 | 4000 |
| 5 | 15 | 900 | 42 | 50.8 | 4000 |
| 6 | 15 | 950 | 44 | 52.5 | 4000 |
| 7 | 15 | 1000 | — | — | — |
| 8 | 25 | 850 | 33 | 49.2 | 4000 |
| 9 | 25 | 900 | 58 | 61.2 | 4000 |
| 10 | 25 | 950 | 60 | 62.4 | 4000 |
| 11 | 25 | 1000 | — | — | — |

As shown in Table 1, for the sample No. 1, the presence of the compound comprising titanium and oxygen was not confirmed, the reflection rate at 500 nm was 40% or less, and the number of cycles was 2800. For the sample Nos. 7 and 11, the heat cycle test was not conducted since pin holes were generated in the glass layer and the metal layer swelled after the thermal treatment.

In contrast, for the sample Nos. 2 to 6 and the sample Nos. 8 to 10, the reflection rate at 500 nm was 40% or more and the number of cycles was 3500 or more.

It was found from this result that when the glass layer contains the compound comprising titanium and oxygen, a light emitting element-mounting substrate which can bring out high luminance and high light emission efficiency for a long period of times is obtained.

For the sample Nos. 4 to 6 and the sample Nos. 8 to 10, the reflection rate at 500 nm was 48.8% or more and the number of cycles was 4000, that is, it was found that the area occupying ratio of the compound in the glass layer is preferably not less than 24 area % and not more than 60 area %.

Example 2

Next, samples having different arithmetic mean roughnesses Ra on the surface of the glass layer were fabricated, and the reflection rate was measured. Fabrication of the sample was conducted in the same manner as for the sample No. 6 in Example 1, and for the sample Nos. 13 to 16, the surface of the glass layer was ground so that the arithmetic mean roughness Ra varied using a surface grinding machine. In this example, the sample No. 12 is the same as the sample No. 6 in Example 1.

The reflection rate was measured in the same manner as in Example 1. The results are shown in Table 2.

TABLE 2

| Sample No. | Ra (μm) | Reflection rate at 500 nm (%) |
|---|---|---|
| 12 | 0.10 | 52.5 |
| 13 | 0.18 | 53.4 |
| 14 | 0.24 | 54.5 |
| 15 | 0.30 | 53.0 |
| 16 | 0.40 | 52.0 |

As shown in Table 2, an improvement in the reflection rate was observed in the sample Nos. 13 to 15. It was found from this result that the reflection rate is improved when the arithmetic mean roughness Ra on the surface of the glass layer is not less than 0.18 μm and not more than 0.3 μm.

Example 3

Next, samples having different contents of copper and zinc in the glass layer were fabricated, and subjected to the heat cycle test and measurement of the reflection rate. In fabrication of the sample, copper powder and zinc powder were added in fabricating the glass paste in the same manner as in Example 1 so that the area occupying ratio of the compound of No. 6 in Example 1 was obtained and contents of copper and zinc shown in Table 3 were obtained, thus, 3 kinds of glass pastes having different contents of copper and zinc were fabricated. Specifically, a first glass paste forming the metal layer side region, a second glass paste forming the intermediate region and a third glass paste forming the surface side region, in the glass layer 3, were fabricated. The first glass paste was printed so as to cover desired regions on the base body and the metal layer, the second glass paste was printed on the first glass paste, and the third glass paste was printed on the second glass paste. The other conditions were the same as for the sample No. 6 in Example 1.

Next, the content of copper and zinc in the glass layer was calculated by the following method. First, each sample was cut in the thickness direction and polished by the CP. Next, the polished cross-section was adopted as an observation surface and observed at 3000-fold magnification using the SEM. The surface side region, the intermediate region and the metal layer side region of the glass layer of each sample were irradiated with X-ray by the EDS attached to the SEM, and the content of copper and zinc was measured.

The area occupying ratio of the compound was determined by the same manner as in Example 1. As a result, the area occupying ratio of the compound was 44 area % for the glass layers of all the samples.

The heat cycle test and measurement of the reflection rate were conducted in the same manner as in Example 1. The results are shown in Table 3.

TABLE 3

| | Glass layer | | | | | | | | | | |
|---|---|---|---|---|---|---|---|---|---|---|---|
| | Metal layer side region | | | Intermediate region | | | Surface side region | | | | |
| Sample No. | Copper (% by mass) | Zinc (% by mass) | Total amount (% by mass) | Copper (% by mass) | Zinc (% by mass) | Total amount (% by mass) | Copper (% by mass) | Zinc (% by mass) | Total amount (% by mass) | Reflection rate at 500 nm (%) | Number of cycles (number) |
| 17 | 2.1 | 0.0 | 2.1 | 0.0 | 0.0 | 0.0 | 0.0 | 0.0 | 0.0 | 52.5 | 4100 |
| 18 | 3.0 | 0.0 | 3.0 | 0.0 | 0.0 | 0.0 | 0.0 | 0.0 | 0.0 | 52.4 | 4200 |
| 19 | 6.3 | 0.0 | 6.3 | 4.5 | 0.0 | 4.5 | 0.0 | 0.0 | 0.0 | 52.1 | 4400 |
| 20 | 6.3 | 0.0 | 6.3 | 0.0 | 0.0 | 0.0 | 9.0 | 0.0 | 9.0 | 49.5 | 4400 |
| 21 | 8.4 | 0.0 | 8.4 | 7.1 | 0.0 | 7.1 | 6.6 | 0.0 | 6.6 | 51.5 | 4500 |
| 22 | 9.1 | 0.0 | 9.1 | 7.9 | 0.0 | 7.9 | 7.6 | 0.0 | 7.6 | 51.3 | 4500 |
| 23 | 9.1 | 0.0 | 9.1 | 10.1 | 0.0 | 10.1 | 7.5 | 0.0 | 7.5 | 50.3 | 4500 |
| 24 | 2.8 | 0.1 | 2.9 | 0.0 | 0.0 | 0.0 | 0.0 | 0.0 | 0.0 | 52.3 | 4100 |
| 25 | 4.4 | 3.0 | 7.4 | 2.8 | 1.2 | 4.0 | 1.1 | 0.0 | 1.1 | 51.8 | 4400 |
| 26 | 7.9 | 5.4 | 13.3 | 6.4 | 3.0 | 9.4 | 5.8 | 1.0 | 6.8 | 51.0 | 4500 |

As shown in Table 3, for the sample Nos. 17 to 19 and 21 to 26, the reflection rate at 500 nm was 50% or more and the number of cycles was 4100 or more. It was found from this result that when the content of copper and zinc in the glass layer is larger in the metal layer side region than in the surface side region, the close adhesion strength between the metal layer and the glass layer is further improved while maintaining the reflection efficiency of visible light on the surface of the glass layer high.

For the sample Nos. 19, 21, 22, 25 and 26, the reflection rate at 500 nm of the sample was 51% or more and the number of cycles was 4300 or more. It was found from this result that it is more preferable that the content of copper and zinc in the glass layer increases gradually from the surface side region to the metal layer side region.

Example 4

Samples in which zirconia is present or absent in the glass layer were fabricated, and the reflection rate was measured. In fabrication of the sample, the sample No. 27 was the same as the sample No. 14 in Example 2, and the sample No. 28 was fabricated in the same manner as for the sample No. 14 in Example 2 except that the zirconia powder was added in an amount of 2 parts by mass and the amount of the glass powder was reduced correspondingly.

The reflection rate was measured by the same manner as in Example 1. The results are shown in Table 4.

TABLE 4

| Sample No. | Presence or absence of zirconia | Reflection rate at 500 nm (%) |
| --- | --- | --- |
| 27 | Absence | 54.5 |
| 28 | Presence | 55.7 |

As shown in Table 4, it was found that the reflection rate is improved when the glass layer contains zirconia.

REFERENCE SIGNS LIST

1: Base body
2: Metal layer
3: Glass layer
4: Light emitting element-mounting substrate
5: Light emitting element
6: Bonding wire
7: Sealing material
10: Light emitting apparatus

What is claimed is:

1. A light emitting element-mounting substrate, comprising:
   a base body formed of ceramics;
   a metal layer disposed on the base body, and comprising copper as a main component; and
   a glass layer disposed on the metal layer, having a white color tone, and comprising a compound comprising titanium and oxygen,
   wherein the glass layer comprises copper or zinc, and a total content of the copper or the zinc in the glass layer is greater in a portion at a metal layer side than in a portion at a surface side in a cross sectional view.

2. The light emitting element-mounting substrate according to claim 1,
   wherein an area occupying ratio of the compound in the glass layer is not less than 24 area % and not more than 60 area %.

3. The light emitting element-mounting substrate according to claim 2,
   wherein an arithmetic mean roughness Ra on a surface of the glass layer is not less than 0.18 μm and not more than 0.3 μm.

4. The light emitting element-mounting substrate according to claim 1,
   wherein the total content of the copper or the zinc in the glass layer increases gradually from the surface side region to the metal layer side region in a cross sectional view.

5. The light emitting element-mounting substrate according to claim 1,
   wherein the glass layer contains zirconia.

6. A light emitting apparatus, comprising:
   the light emitting element-mounting substrate according to claim 1; and
   a light emitting element disposed on the metal layer.

* * * * *